United States Patent [19]

Sherrill

[11] Patent Number: 5,040,137

[45] Date of Patent: Aug. 13, 1991

[54] RANDOM ACCESS FIR FILTERING

[75] Inventor: James V. Sherrill, Norris, Tenn.

[73] Assignee: Audio Animation, Knoxville, Tenn.

[21] Appl. No.: 449,791

[22] Filed: Dec. 13, 1989

[51] Int. Cl.⁵ .............................................. G06F 15/31
[52] U.S. Cl. ............................................... 364/724.16
[58] Field of Search ....................... 364/724.16, 724.17, 364/724.15

[56] References Cited

U.S. PATENT DOCUMENTS

| | | | |
|---|---|---|---|
| 4,369,499 | 1/1983 | Northam | 364/724.16 |
| 4,561,065 | 12/1985 | Matsuda | 364/724.17 |
| 4,766,561 | 8/1988 | Thompson et al. | 364/724.13 |
| 4,809,208 | 2/1989 | Hansen et al. | 364/724.12 |

Primary Examiner—David H. Malzahn
Attorney, Agent, or Firm—Fleit, Jacobson, Cohn, Price, Holman & Stern

[57] ABSTRACT

A finite impulse response filter that has the ability to use arbitrary TAPs that are essentially random access TAPs includes a plurality of circuits. The samples it operates on do not need to be a contiguous form. A sequencer is provided for counting up to a programmable number each time a start pulse is encountered and to provide an address and an incrementing address to a delta RAM, a coefficient RAM, and a micro code RAM. The delta RAM is used for storing the number of the TAP that is to be accessed. Delta Adders that directly follow the delta RAM are used with an input counter for making a ring counter for the input samples. A first and second sample RAM are used to hold incoming samples. An adder circuit is used for adding the output of the two sample RAMs to provide an output signal. A multiplier accumulator is connected to the adder circuit for receiving the output signal. The sequencer provides all the timing for the different cycles of the multiplier accumulator. After a programmed amount of samples have been added together, the multiplier accumulator outputs its value onto an input/output bus, where all the input and output samples either originate or end.

5 Claims, 2 Drawing Sheets

RANDOM ACCESS FIR FILTERING

BACKGROUND OF THE INVENTION

1. Field of the Invention

The present invention pertains to digital filters and more particularly to finite impulse response filters used in conjunction with digital signals.

2. Related Prior Art

An ordinary FIR (Finite Impulse Response) filter requires the input data to be in contiguous form (i.e. consecutive samples in time). The standard equation for an N length FIR filter is as follows.

$$Y(t) = \sum_{i=-N}^{+N} (C_i \cdot X(t))$$

The Equation specifies that ALL the samples from $-n$ to $+n$ are used in the calculations. A simple 5 TAP (a TAP is referred to as a single Multiplication/Accumulation) FIR filter is shown in FIG. 1. Notice that the data always moves through the filter in a contiguous fashion from the left to the right. The coefficients in this example are $C_{-2}$, $C_{-1}$, $C_0$, $C_{+1}$, $C_{+2}$. Where $C_{-n} = C_{+n}$ in all linear phase FIR filters. If any coefficient has the value of 0, then it essentially has no effect on the process. If a method could be found that would allow the removal of the 0 coefficients, then a more efficient filter could be made on certain filters (not all filters have 0's in their coefficients). An architecture that allows the removal of 0 coefficients allows the FIR filter to perform many functions that otherwise would not be possible.

For simplicity, the following explanation does not deal with the multi-input, multi-output filters. All filters are treated as having one input and a single output. Many of the principles discussed are directly applicable to multi-input and multi-output systems.

The following discussion is also restricted to digital filters in one of two forms: non-recursive or recursive. A non-recursive filter generates its output by simply weighing the inputs by constants and then summing the weighted inputs. The constants are called coefficients and the constants determine the filter. A design of a filter is tantamount to computing the values for these coefficients. The non-recursive filter is defined below.

$$y_k = c_m x_{k-m} + c_{m-1} x_{k-m+1} + \ldots + c_0 x_k + \ldots + c_{-m+1} x_{k+m-1} + c_{-m} x_{k+m}$$

This filter computes the "current" output, $y_k$, from the current input, $x_k$, and the m inputs that precede $x_k$, $x_{k-1} \ldots x_{k-m}$, and the m inputs that follow $x_k$, $x_{k+1} \ldots x_{k+m}$. The output is a weighted sum of the current input and its 2m "neighbors". Note that the inputs do not contribute equally to the output. The contribution of each data element is governed by the coefficient with which it is multiplied. If the coefficient is large, the particular data element has a proportionally large effect on the filter's output. For example, if the zero-th coefficient, $c_0$, is zero the input, $x_k$, has no effect on $y_k$, However, $x_k$ may affect the future outputs $y_{k+1}, y_{k+2}, \ldots$ Or simply:

$$\sum_{i=-m}^{m} a_i = a_m + a_{-m+1} + \ldots a_{m-1} + a_m$$

The second form of digital filter is recursive. In this case, the output is not only a function of the inputs, but it also depends on the past outputs. The recursive digital filter is defined below.

$$y_k = \sum_{i=-m}^{m} c_i x - i + \sum_{j=1}^{n} d_j y_{k-j}$$

The first sum is that of the nonrecursive filter. The second sum is called the recursive portion of the filter. This second sum shows how the outputs is related to past outputs. The recursive coefficients are denoted $d_j$, and are used to weight the past outputs $y_{k-j}$. When all the recursive coefficients are zero, this becomes a non-recursive filter. Therefore, the nonrecursive filter is really a special case of the recursive filter.

This filter is implemented in a similar manner as the nonrecursive filter. Pick a particular index, k, and compute the output for that index. However, the operation of the recursive filter is complicated by the fact that the output at time k depends on previous outputs as well as the inputs. Therefore, these filters must be operated sequentially, that is, the output for index k must be computed before the output for index $k+1$.

SUMMARY OF THE INVENTION

The present invention provides a finite impulse response filter that has the ability to use arbitrary TAPs that are essentially random access TAPs. Digital samples originate on an input/output bus and are received through an interface. The samples that the present invention operates on do not need to be a contiguous from. A sequencer is provided for counting up to a programmable number each time a start pulse is encountered and to provide an address and an incrementing address to a delta RAM, a coefficient RAM, and a micro code RAM. The delta RAM is used for storing the number of the TAP that is to be accessed. Delta Adders that directly follow the delta RAM are used with an input counter for making a ring counter or circular RAM buffer for the input samples. A first and second sample RAM are used to hold incoming samples. An adder circuit is used for adding the output of the two sample RAMs to provide an output signal. A multiplier accumulator is connected to the adder circuit for receiving the output signal. The sequencer provides all the timing for the different cycles of the multiplier accumulator. After a programmed amount of samples have been added together, the multiplier accumulator outputs its value onto the input/output bus through the interface.

DESCRIPTION OF THE PREFERRED EMBODIMENT

The present invention provides a filter that has the ability to use arbitrary TAPs. The TAPs that are used are essentially RANDOM ACCESS TAPs. The samples it operates on do not need to be a contiguous from.

Take for example a simple audio ECHO. If the ECHO is simply a scaled version of the original signal, delayed in time by T samples, then for a standard FIR filter to create this, it would require at least T+1 TAPs. Where all the TAPs would have coefficients of 0 except the first and last TAP. Standard ECHOes in audio range from 1 ms to 5 seconds. If a CD rate of 44.1 khz sample rate is used, then to implement the above in a FIR filter would require up to 5*44100 TAPs or 220,050 TAPs total. Clearly in this case the FIR filter is not a practical way to implement ECHO. If however, the FIR filter was able to ignore the 0 TAPs in the filter, then the above would require only two TAPs. Now the FIR filter becomes a very efficient way to create the ECHO effect. This is obviously a very simple example, but it illustrates the advantage of the present invention of not using the 0 TAPs.

REVERB is the accumulation of many echoes all scaled in time, value, and frequency response, the FIR filter of the present invention with the ability to remove 0 taps is extremely powerful. By removing all the 0's or even relatively small coefficients, a very powerful reverb is made possible by the FIR filter of the present invention.

Figure 1:
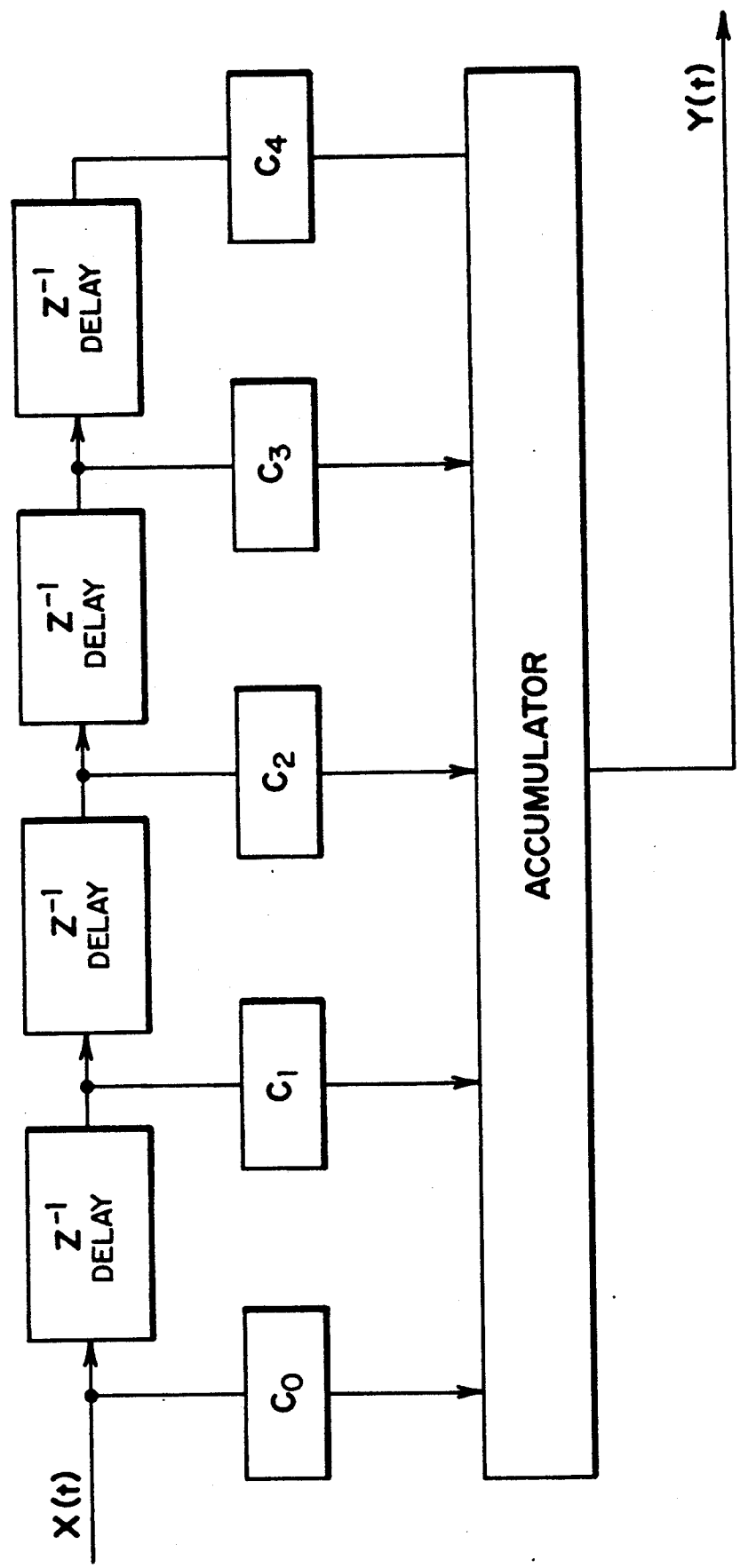
FIG. 1 is a block diagram of a simple five-tap finite impulse response filter.
Figure 2:
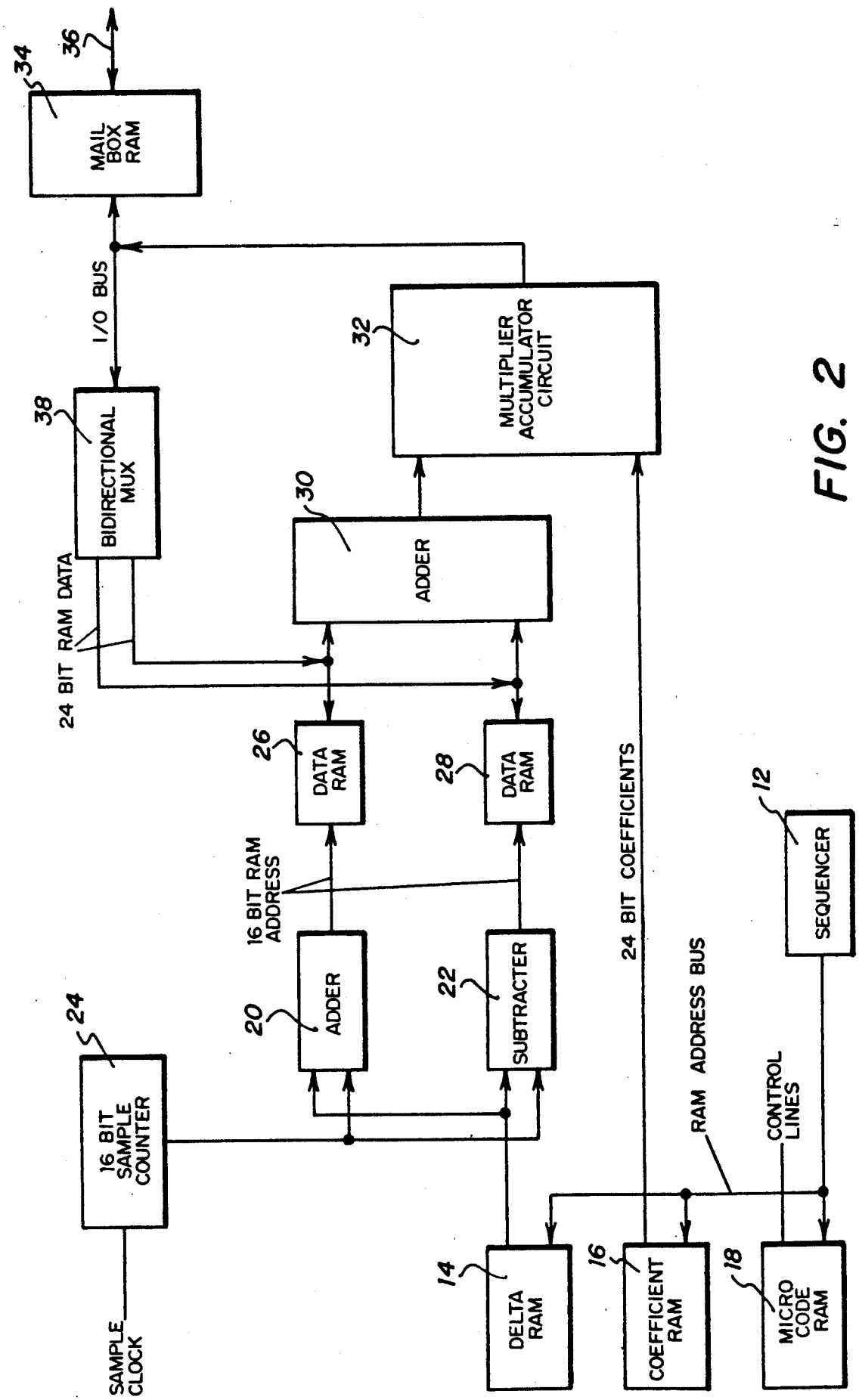
FIG. 2 is a block diagram of a finite impulse response digital filter which has random access taps.

Having the ability to remove unwanted coefficients also allows the ability to have more than one filter/system. In other words, if several different signals were input to a system and each needed its own filter, this would allow each signal to processed independently of the others. A block diagram of this circuit is shown in FIG. 2. A brief description of the circuit follows.

Referring now to FIG. 2, block diagram of the circuit of the present invention is illustrated. A sequencer 12 sends controls signals to delta RAM 14, coefficient RAM 16 and micro code RAM 18. Delta RAM 14 sends information to adder 20 and subtracter 22, both of which also receive information from sample counter 24. Adder 20 supplies information to a data RAM 26 while subtracter 22 supplies information to a data RAM 28. The output of data RAM 26 and data RAM 28 are both fed to an adder 30. Adder 30 supplies one input to multiplier accumulator circuit 32. Multiplier accumulator 32 also receives information from coefficient RAM 16. Multiplier accumulator 32 provides filtered digital signals to external input/output interface 34. External input/output interface 34 supplies these filtered digital signals and receives unfiltered digital signals from BUS 36. Raw digital signals received by external input/output interface 34 are transmitted to bi-directional multiplexer 38 which provides inputs to data RAM 26 and data RAM 28.

In operation, the sequencer 12 is used to count up to a programmable number each time a start pulse is encountered. The start pulse is triggered by the sample clock. The sequencer provides the address for the different RAMs in the circuit and provides timing based on different events. The current sequencer runs at 50 ns/cycle<22.6 μs). The sequence also provides an incrementing address to delta RAM 14, coefficient RAM 16, and the micro code RAM 18. The addresses go from 0 to 454, but are not limited to any particular number.

Delta RAM 14 is used to store the number of the TAP that is to be accessed. This is the displacement of the TAP from T=0. That is a value of "1" would mean use the sample value at T=1, a value of "34A3" (hex) would mean use the sample value at T=34A3 (hex), and a value of "−1192" would means use the sample value at T=−1192. This RAM allows the FIR filter to have RANDOM ACCESS TAPs (the TAPs do not have to be contiguous). The DELTA RAMs address comes from the sequencer. It always starts at 0 and goes up to the maximum value from the sequencer.

External input/output interface 34 receives digital signals from Bus 36 and transmits them to bi-directional multiplexer 38. Bi-directional multiplexer 38 provides the signals to data RAM's 26 and 28. The first sample, sample counter 24 provides count to adder 20 and subtracter 22. This count is combined with the output of delta RAM 14.

Data RAM's 26 and 28 comprise a circular ram buffer with addresses from 0000 to FFFF. Information from delta RAM 14 is feed to both adder 20 and subtracter 22. Sample counter 24 provides input count, such as one, to both adder 20 and subtracter 22. Adder 20 takes the previous number, for example zero, and the information from delta RAM 14 and places the sample in memory at location 0001. At the same time, the input from sample counter 24, when fed to subtracter 22, is decreased by one. Started with value of 0, the address is move back to FFFF. Thus, the combination of information from data RAM 26 and data RAM 28, when fed to adder 30, provides equivalent values symmetrical around the initial starting point.

The output of adder 30 is fed to multiplier accumulator circuit 32. The two values which are symmetrical around the 0 starting point are multiplied in multiplier accumulator 32 by a coefficient value. In a normal by finite impulse response filter, the negative value, $x_{-i}(t)$, is multiplied by a coefficient and the positive value, $x_i(t)$, is multiplied by the coefficient and then added together. This requires two multipliers and one adder. In the present invention, the positive value and the negative value are added and then multiplied by the coefficient, thus requiring only one adder and one multiplier.

Adder 20 and subtracter 22 that directly follow delta RAM 14 are used with sample counter 24 to make a ring counter for the input samples. The current implementation of this ring counter is 16 bits, however this could easily be larger or smaller. This ring counter is used with data RAM's 26 and 28 to make a ring buffer of input samples. The results of the adders provide the address to the input sample RAM. This process essentially makes delta RAM 14 an offset pointer to the most current values of the input buffer. This is best explained by some examples.

If delta RAM 14, at sequence "0", has the value of "0", then the output of adder 20 and subtracter 22 (at sequence 0) will always equal to the value of the sample counter. This value will essentially increment over time by "1" each time a sample occurs. After 64K (16 bits overflow) samples, the output of adder 20 and subtracter 22 (at sequence 0) will be the same value again. If the new input sample is stored in data RAM's 26 and 28 at the address created by adder 20 and subtracter 22 at sequence "0", then a simple ring buffer has been created. If delta RAM 14 at sequence "1" has the value of "−7", then the address to data RAM's 26 and 28 will always point the 7th previous sample, regardless of the position in the ring buffer of the current sample.

Another way to think of this process, is that delta RAM 14 always points to the relative values of the incoming samples. A delta value of 8 will always point the 8th future sample of the incoming samples. A value of −87 will always point the 87th previous value of the incoming samples.

Data RAM's 26 and 28 are used to hold the incoming samples. It has no inherent limit on its word size or its capacity. The are two separate RAMs in the system. It is a fact that in linear current implementation is 64K by 24 bits. You will note there are two separate RAMs in the system. It is a fact that in linear phase FIR filtering, the coefficients used are exactly symmetrical about the origin. The coefficient at T=−34 is the same as the coefficient at T=34. Therefore, one could add the two sample values together at T=34 and T=−34, and multiply by the coefficient (34). This requires one multiply/accumulate and one add for two TAPs. Because adders are very small and economical compared to multipliers, this is a very easy way to double the number of TAPs while adding only a small number of parts.

The output of data RAM's 26 and 28 are added together before they go to multiplier accumulator 32. Adder 30 is only used when linear phase filters are used. The output of adder 30 goes to multiplier accumulator 32. The other input to multiplier accumulator 32 is the coefficients from coefficient RAM 16. They are 24 bits wide but can be any width depending on the accuracy that is required. Multiplier accumulator 32 is used to multiply the coefficients against the input samples and sum them together. After multiplier accumulator 32 the circuit becomes similar to standard implementations of a FIR filter.

Sequencer 12 provides all the timing for the different cycles of multiplier accumulator 32 and after a programmed amount of samples have been added together multiplier accumulator 32 outputs its value onto bus 36 through interface 34.

Bus 36, through interface 34, is where all the input/output samples originate/end. This is a 24 bit path that provides paths to and from data RAM's 26 and 28, and multiplier accumulator 32. The size of the path is determined by data RAM's 26 and 28. The current implementation of this is 24 bits wide.

The circuit described can be used to implement a wide variety of digital filters; FIR, IIR, and LATTICE are all easily implemented in the above circuit. Also, because delta RAM 14 is programmable, more than one filter can be implemented at the same time. There is no inherent limit on the number of filters that can be in the same filter, but practical limitations are approximately about one hundred.

The block diagram described is shown in a very simplified form, and not all the data paths are shown for clarity. For simplicity, the diagram also does not show pipeline logic.

While the present invention has been described by way of a preferred embodiment, it is to be understood that this is for illustration purposes only and that the present invention should not be limited thereto, but only by the scope of the following claims.

What is claimed is:

1. A finite impulse response filter comprising:
   interface means for receiving unfiltered digital data samples;
   first memory means for storing said unfiltered digital data samples;
   counter means for providing a count value;
   second memory means for storing TAP access information;
   third memory means for storing predetermined coefficient values;
   combining means connected to said counter means and said second memory means and to said first memory means for combining said count value and said TAP access information to produce first and second address signals used as address signals for storage of the digital data samples in said first memory means;
   adder means connected to said first memory means for receiving and adding digital data samples stored in said first memory means at addresses defined by said first and second address signals to produce a sum sample signal; and
   multiplier means connected to said adder means and said third memory means for multiplying said sum sample signal by a predetermined coefficient value stored in said third memory means.

2. The finite impulse response filter according to claim 1, and further comprising:
   fourth memory means for storing control codes to govern data flow; and
   sequencer means connected to said fourth memory means for controlling said second memory means and said third memory means through said control codes.

3. The finite impulse response filter according to claim 2, wherein said first memory means includes a first memory for storing selected values and a second memory for storing values symmetrical to said selected values.

4. A method for filter digital data signals comprising the steps of:
   receiving unfiltered digital data samples;
   storing said unfiltered digital data samples in a first memory;
   providing a count value;
   storing TAP access information in a second memory;
   storing predetermined coefficient values in a third memory;
   combining said count value and said TAP access information to produce first and second address signals used for storage of digital data samples in said first memory;
   adding digital data samples stored at addresses in said first memory defined by said first and said address signals to produce a sum sample signal; and
   multiplying said sum sample signal by a predetermined coefficient value stored in the third memory.

5. A finite impulse response filter comprising:
   interface mans for receiving unfiltered digital data samples;
   first memory means for storing said unfiltered digital data samples, said first memory means comprising a first memory for storing selected values and a second memory for storing values symmetrical to said selected values;
   counter means for providing a count value;
   second memory means for storing TAP access information;
   third memory means for storing predetermined coefficient values;
   combining means connected to said counter means and said second memory means and to said first memory means for combining said count value and said TAP access information to produce first and second address signals used for storage of the digital data samples in said first memory means;
   adder means connected to said first memory means for receiving and adding digital data samples stored in said first memory means at addresses defined by said first and second address signals to produce a sum sample signal; and multiplier means connected to said adder means and said third memory means for multiplying said sum sample signal by a predetermined coefficient value stored in said third memory means;

fourth memory means for storing control codes to govern data flow; and sequencer means connected to said fourth memory means for controlling said second memory means and said third memory means through said control codes.

* * * * *